United States Patent [19]

Berman et al.

[11] Patent Number: 4,618,526

[45] Date of Patent: Oct. 21, 1986

[54] CURABLE COMPOSITIONS CONTAINING MULTIGLYCIDYL ETHERS AND A SULFONIC ACID AMIDE

[75] Inventors: Jody R. Berman, Lake Jackson; Dennis L. Steele, Freeport; Michael P. Kubisiak, Lake Jackson, all of Tex.

[73] Assignee: The Dow Chemical Company, Midland, Mich.

[21] Appl. No.: 757,692

[22] Filed: Jul. 22, 1985

[51] Int. Cl.$^4$ .................. C08G 59/32; C08G 59/40
[52] U.S. Cl. .................................. 428/209; 428/418; 428/901; 525/523; 528/98; 528/109
[58] Field of Search .................. 528/98, 109; 525/523; 428/418, 209, 901

[56] References Cited

U.S. PATENT DOCUMENTS

| | | | |
|---|---|---|---|
| 3,277,050 | 10/1966 | Pettigrew | 260/47 |
| 3,787,451 | 1/1974 | Mah | 260/348 R |
| 3,819,581 | 6/1974 | Smith | 260/47 EN |
| 3,849,375 | 11/1974 | Smith | 528/109 |
| 4,254,015 | 3/1981 | Thomas et al. | 260/45.9 R |
| 4,394,496 | 7/1983 | Schrader | 528/98 |
| 4,528,359 | 7/1985 | Berman et al. | 528/109 |

*Primary Examiner*—Earl Nielsen
*Attorney, Agent, or Firm*—J. G. Carter

[57] ABSTRACT

Curable compositions are disclosed which comprise a multiglycidyl ether such as the triglycidylether of tris(-hydroxyphenyl)methane and an amine substituted sulfonic acid amide such as sulfanilamide. These compositions can be cured by heating in the presence or absence of an accelerator such as 2-methyl imidazole. These compositions are particularly useful in the preparation of electrical laminates.

25 Claims, No Drawings

CURABLE COMPOSITIONS CONTAINING MULTIGLYCIDYL ETHERS AND A SULFONIC ACID AMIDE

BACKGROUND OF THE INVENTION

The present invention pertains to curable compositions containing multiglycidyl ethers and a sulfonic acid amide and the resultant cured products.

Pettigrew has disclosed curing epoxy resins with sulfonic acid amides in U.S. Pat. No. 3,277,050. Mah and Schrader have disclosed curing glycidyl ethers of tris(hydroxyphenyl) alkanes with various curing agents, in U.S. Pat. No. 3,787,451 and U.S. Pat. No. 4,394,496, respectively. However, Pettigrew does not disclose curing glycidyl ethers of tris(hydroxyphenyl) alkanes as suitable epoxy resins and Mah and Schrader do not disclose sulfanilimide as a suitable curing agent.

The applicants herein have found that the products resulting from curing glycidyl ethers of tris(hydroxyphenyl) alkanes with sulfanilamide unexpectedly have an improvement in toughness ($G_{1C}$) while maintaining a relatively high thermal transition (Tg) temperature.

SUMMARY OF THE INVENTION

The present invention pertains to a curable composition comprising a mixture of
(A) at least one of
  (1) at least one epoxy resin represented by formulas ((I) or (II) wherein each B is represented by the formula

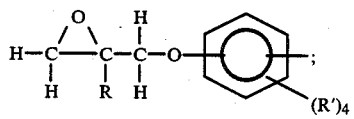

each B' is represented by the formula

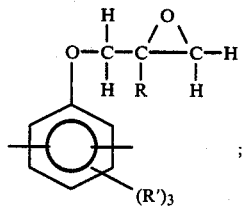

each B" is represented by the formula

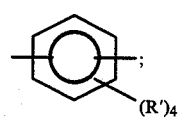

each R is independently hydrogen or an alkyl group having from 1 to about 4 carbon atoms; each Q is independently hydrogen or a hydrocarbyl group having from 1 to about 10 carbon atoms; each R' is independently hydrogen, a hydrocarbyl or hydrocarbyloxy group having from 1 to about 10 carbon atoms or a halogen; m has a value of n−1; m' has a value of n'−1; m" has a value of n"−1; each n, n' and n" independently has a value from zero to about 3; q has a value from zero to about 4; and each z and z' independently has a value from zero to about 3;
(2) the reaction product of
  (a) at least one epoxy resin represented by formulas (I) or (II) as defined in component (A-1); and
  (b) at least one dihydric phenol represented by formulas (III) or (IV) wherein A is a divalent hydrocarbon group having from 1 to about 12 carbon atoms; —S—, —S—S—,

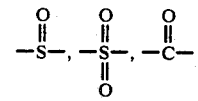

or —O—; each Y is independently hydrogen, a halogen or a hydrocarbyl or hydrocarbyloxy group having from 1 to about 10 carbon atoms; and n has a value of zero or 1; and wherein components (a) and (b) are present in quantities such that the ratio of phenolic hydroxyl groups to epoxide groups is from about 0.01:1 to about 0.5:1, preferably from about 0.05:1 to about 0.25:1, most preferably from about 0.1:1 to about 0.2:1; or
  (3) mixtures thereof; and
(B) at least one amine substituted aromatic sulfonic acid amide represented by formula (V) wherein each X is independently hydrogen, a monovalent hydrocarbyl group having from 1 to about 10 carbon atoms or a halogen; and wherein components (A) and (B) are present in quantities such that the ratio of epoxy groups to hydrogen atoms attached to a nitrogen atom is from about 0.8:1 to about 2:1, preferably from about 0.9:1 to about 1.25:1.

Another aspect of the present invention pertains to a composition comprising a mixture of
(A) at least one of
  (1) at least one epoxy resin represented by formulas (I) or (II) wherein each B is represented by the formula

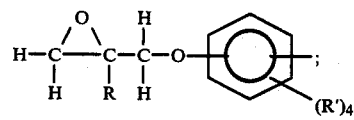

each B' is represented by the formula

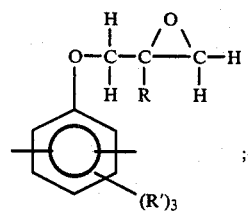

each B" is represented by the formula

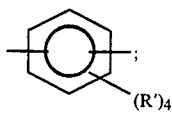

each R is independently hydrogen or an alkyl group having from 1 to about 4 carbon atoms; each Q is independently hydrogen or a hydrocarbyl group having from 1 to about 10 carbon atoms; each R' is independently hydrogen, a hydrocarbyl or hydrocarbyloxy group having from 1 to about 10 carbon atoms or a halogen; m has a value of $n-1$; m' has a value of $n'-1$; m" has a value of $n''-1$; each n, n' and n" independently has a value from zero to about 3; q has a value from zero to about 4; and each z and z' independently has a value from zero to about 3;

(2) the reaction product of
  (a) at least one epoxy resin represented by formulas (I) or (II) and
  (b) at least one dihydric phenol represented by the formulas (III) or (IV) wherein A is a divalent hydrocarbon group having from 1 to about 12 carbon atoms, —S—, —S—S—,

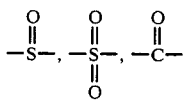

or —O—; each Y is independently hydrogen, a halogen or a hydrocarbyl or hydrocarbyloxy group having from 1 to about 10 carbon atoms; and n has a value of zero or 1; and wherein components (a) and (b) are present in quantities such that the ratio of phenolic hydroxyl groups to epoxide groups is from about 0.01:1 to about 0.5:1, preferably from about 0.05:1 to about 0.25:1, most preferably from about 0.1:1 to about 0.2:1, or (3) mixtures thereof;

(B) at least one amine substituted aromatic sulfonic acid amide represented by formula (V) wherein each X is independently hydrogen, a monovalent hydrocarbyl group having from 1 to about 10 carbon atoms or a halogen; and (C) from zero to about 50, preferably from about 10 to about 45, most preferably from about 30 to about 40, percent by weight of the combined weight of components (A), (B), (C) and (D) of at least one solvent; and wherein components (A) and (B) are present in quantities such that the ratio of epoxy groups to hydrogen atoms attached to a nitrogen atom is from about 0.8:1 to about 2:1, preferably from about 0.9:1 to about 1.25:1.

The present invention also pertains to substrates impregnated with the aforementioned compositions and to laminates prepared therefrom.

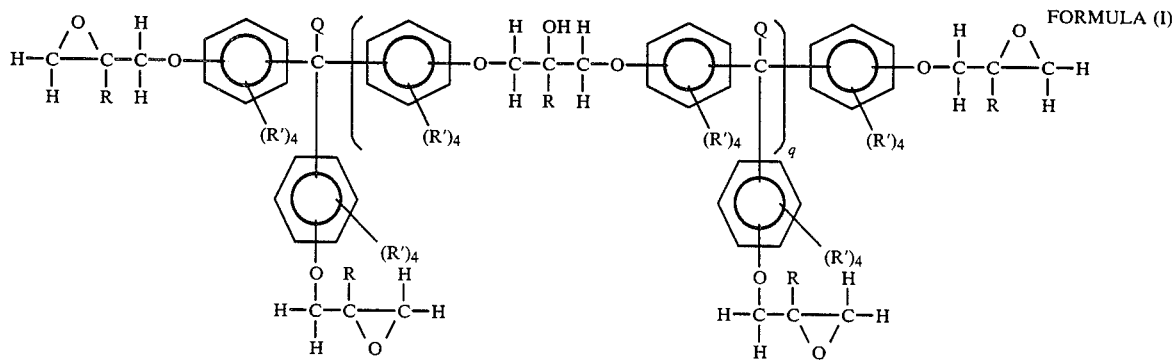

FORMULA (I)

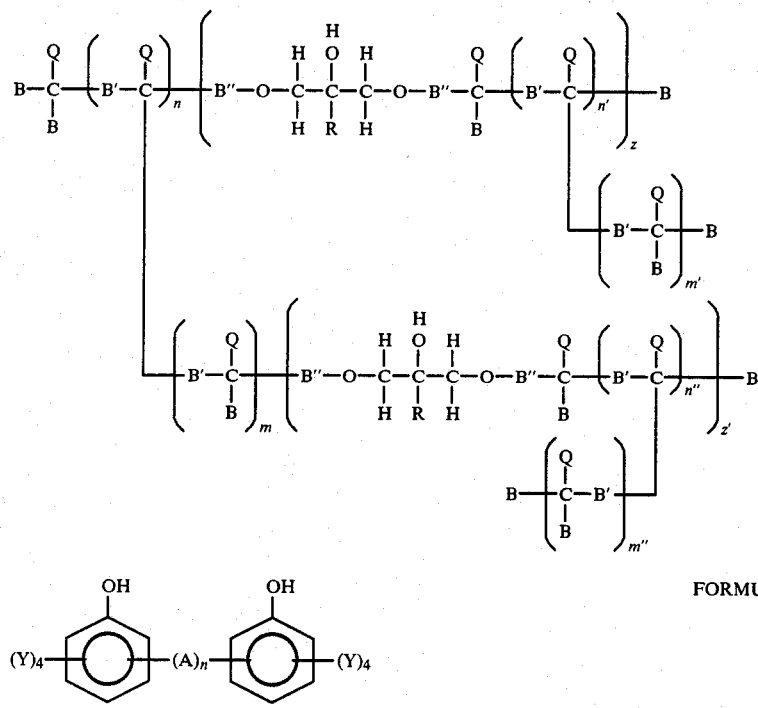

FORMULA (II)

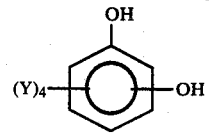

FORMULA (III)

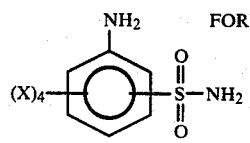

FORMULA (IV)

FORMULA (V)

DETAILED DESCRIPTION OF THE PRESENT INVENTION

Particularly suitable amine substituted aromatic sulfonic acid amides which can be employed herein include, for example, sulfanilamide, 4-amino-2-chlorobenzenesulfonamide, 4-amino-2-methylbenzenesulfonamide, sulfanilylsulfanilamide, 2-aminobenzenesulfonamide, mixtures thereof and the like.

Particularly suitable trisphenol based epoxy resins which can be employed herein include, for example, the triglycidyl ether of tris(hydroxyphenyl)methane, higher molecular weight homologs thereof, and trisepoxides advanced with dihydric phenols, mixtures thereof and the like.

Particularly suitable dihydric phenols and halogenated dihydric phenols include, for example, bisphenol A, tetrabromobisphenol A, bisphenol S, tetrabromobisphenol S, biphenol, tetrabromobiphenol, tetrabromodihydroxybenzophenone, resorcinol, tetrabromoresorcinol, mixtures thereof and the like.

Suitable catalysts for effecting the reaction between the epoxy resin and the phenolic hydroxyl-containing compound include, for example, those disclosed in U.S. Pat. Nos. 3,306,872; 3,341,580; 3,379,684; 3,477,990; 3,547,881; 3,637,590; 3,843,605; 3,948,855; 3,956,237; 4,048,141; 4,093,650; 4,131,633; 4,132,706; 4,171,420; 4,177,216; 4,302,574; 4,320,222; 4,358,578; 4,366,295; and 4,389,520, all of which are incorporated herein by reference.

Particularly suitable catalysts are those quaternary phosphonium and ammonium compounds such as, for example, ethyltriphenylphosphonium chloride, ethyltriphenylphosphonium bromide, ethyltriphenylphosphonium iodide, ethyltriphenylphosphonium acetate, ethyltriphenylphosphonium diacetate (ethyltriphenylphosphonium acetate.acetic acid complex), ethyltriphenylphosphonium tetrahaloborate, tetrabutylphosphonium chloride, tetrabutylphosphonium acetate, tetrabutylphosphonium diacetate (tetrabutylphosphonium acetate.acetic acid complex), tetrabutylphosphonium tetrahaloborate, butyltriphenylphosphonium tetrabromobisphenate, butyltriphenylphosphonium bisphenate, butyltriphenylphosphonium bicarbonate, benzyltrimethylammonium chloride, benzyltrimethylammonium hydroxide, benzyltrimethylammonium tetrahaloborate, tetramethylammonium hydroxide, tetrabutylammonium hydroxide, tetrabutylammonium tetrahaloborate, and mixtures thereof and the like.

Other suitable catalysts include tertiary amines such as, for example, triethylamine, tripropylamine, tributylamine, 2-methylimidazole, benzyldimethylamine, mixtures thereof and the like.

Other suitable catalysts include ammonium compounds such as, for example, triethylammonium chloride, triethylammonium bromide, triethylammonium iodide, triethylammonium tetrahaloborate, tributylammonium chloride, tributylammonium bromide, tributylammonium iodide, tributylammonium tetrahaloborate, N,N'-dimethyl-1,2-diaminoethane.tetrahaloboric acid complex, and mixtures thereof and the like.

Other suitable catalysts include quaternary and tertiary ammonium phosphonium, and arsonium adducts or complexes with suitable non-nucleophilic acids such as, for example, fluoboric, fluoarsenic, fluoantimonic, fluophosphoric, perchloric, perbromic, periodic, mixtures thereof and the like.

Suitable solvents which can be employed herein include, for example, ketones, alcohols, glycol ethers and amides, such as, for example, acetone, methyl ethyl ketone, methanol, propylene glycol mono methyl ether and dimethyl formamide.

If desired, the composition of the present invention can contain accelerators for the reaction between the epoxy resin and the amine substituted aromatic sulfonic acid amide. Suitable accelerators include, for example, 2-methyl imidazole, 2-ethyl-4-methylimidazole, 2-isopropylimidazole, 1-propylimidazole, 2-heptadecylimidazole, benzyldimethylamine, ethyltriphenylphosphonium acetate, ethyltriphenylphosphonium chloride, ethyltriphenylphosphonium bromide, ethyltriphenylphosphonium iodide, ethyltriphenylphosphonium diacetate (ethyltriphenylphosphonium acetate.acetic acid complex), ethyltriphenylphosphonium tetrahaloborate, tetrabutylphosphonium chloride, tetrabutylphosphonium acetate, tetrabutylphosphonium diacetate (tetrabutylphosphonium acetate.acetic acid complex), tetrabutylphosphonium tetrahaloborate, butyltriphenylphosphonium tetrabromobisphenate, butyltriphenylphosphonium bisphenate, butyltriphenylphosphonium bicarbonate, benzyltrimethylammonium chloride, benzyltrimethylammonium hydroxide, benzyltrimethylammonium tetrahaloborate, tetramethylammonium hydroxide, tetrabutylammonium hydroxide, tetrabutylammonium tetrahaloborate, triethylamine, tripropylamine, tributylamine, 2-methylimidazole, benzyldimethylamine, triethylammonium chloride, triethylammonium bromide, triethylammonium iodide, triethylammonium tetrahaloborate, tributylammonium chloride, tributylammonium bromide, tributylammonium iodide, tributylammonium tetrahaloborate, N,N'-dimethyl-1,2-diaminoethane.tetrahaloboric acid complex, mixtures thereof and the like.

The compositions of the present invention may also contain, if desired, pigments, dyes, mold release agents, flow control agents, reinforcing agents, fillers, fire retardant agents, rubber modifiers, surfactants, accelerators, reactive diluents, mixtures thereof and the like.

The compositions of the present invention are suitable for such applications as structural or electrical laminates or composites, coatings, adhesives, castings, moldings, electronic encapsulations and in potting compositions.

Suitable substrates which can be employed herein include, for example, fibers or filaments in woven, matt or non-woven form of glass, carbon, graphite, synthetic fibers, quartz, ceramic, combinations thereof and the like.

The following examples are illustrative of the invention but are not to be construed as to limiting the scope thereof in any manner.

Fracture Toughness Measurement ($G_{1C}$)

The method for measuring $G_{1C}$ (fracture toughness or "critical strain energy release rate") is an adaptation of ASTM E-399 for plastics materials from the original usage with metals. The compact tension test is now widespread in usage and is described in *J. Mater. Sci.,* Vol. 16, 2657, 1981. An individual test piece is cut as an approximate 1" (25.4 mm) square from a flat casting usually of $\frac{1}{8}$" (3.175 mm) thickness. A dovetail notch is cut into one edge, centered, about $\frac{1}{4}$" (6.25 mm) in depth. Next, a razor blade is inserted into this notch and tapped to produce a precrack. Two holes are then drilled adjacent to the dovetail as indicated in ASTM E-399, allowing the test piece to be pinned into position in the Instron test machine. Extension of the sample now allows the force required to propagate opening of the precrack to be measured, using a test speed of 0.02 inch/minute (0.0085 mm/sec.). This force is used in the equation given in ASTM E-399, along with the required sample dimensions and actual precrack length, to calculate a "stress intensification factor" $K_Q$. This is then combined with the tensile modulus and Poisson's ratio for the material to give the value for $G_{1C}$, usually reported in ergs/cm$^2\times 10^6$. A scale comparing typical values for $G_{1C}$ for various plastics and metals is given in reference Lee, L. H., "Physicochemical Aspects of Polymer Surfaces", K. L. Mittal, ed. Plenum Press, New York, N.Y., 1983.

Tg was determined using a DuPont Dynamic Mechanical Analyzer (Model No. 982 with a DuPont 1090 controller).

Tensile and flexural properties were measured using ASTM method D-638-60 and D-790-58T, respectively.

The following components were employed in the examples and comparative experiments.

Epoxy Resin A was a polyglycidyl ether of a phenol/hydroxybenzaldehyde condensation product having an EEW of 163 and an average functionality of about 3.2.

Epoxy Resin B was a polyglycidyl ether of a phenol/glyoxal condensation product having an average functionality of about 4.2 and an EEW of 231.

Epoxy Resin C was a polyglycidyl ether of a phenol/formaldehyde condensation product having an EEW of 178 and an average functionality of about 3.5.

Epoxy Resin D was a polyglycidyl amine prepared from p-amino phenol having an average functionality of about 3 and an EEW of 187.

Curing Agent A was sulfanilamide which has an amine hydrogen equivalent weight of 43.

Curing Agent B was methylene dianiline which has an amine hydrogen equivalent weight of 49.5.

Curing Agent C was diamino diphenyl sulfone which has an amine hydrogen equivalent weight of 62.

EXAMPLE 1

400 g (2.454 eq.) or Epoxy Resin A was heated to a liquid state at 150° C. To this resin was added 84.9 g of Curing Agent A (0.8 eq. sulfanilamide/eq. epoxy) and stirred until completely dissolved. (Note: both of these monomers were degassed separately prior to mixing). The resin solution was then poured into an aluminum mold with $\frac{1}{8}$ inch (0.3175 cm) inside spacing and placed in the oven at 150° C. The cure schedule consisted of 1 hour (3600 s) at 150° C., 2 hours (7200 s) at 200° C., 2 hours (7200 s) at 225° C., and 1 hour (3600 s) at 250° C. The casting was then cooled to room temperature and removed for evaluation. The resultant cured product had the properties reported in Table I.

TABLE I

|  | PRODUCT FROM EXAMPLE 1 |
|---|---|
| Tg, °C. | 304 |
| Tensile Strength, |  |
| psi | 9,100 |
| kPa | 62,743 |
| Tensile Modulus, |  |
| psi | 5.43 × 10$^5$ |
| kPa | 37.44 × 10$^5$ |
| Elongation, % | 2.4 |
| Flexural Strength at 77° F. (25° C.), |  |
| psi | 19,305 |
| kPa | 133,104 |
| Flexural Modulus at 77° F. (25° C.), |  |
| psi | 6.55 × 10$^5$ |
| kPa | 45.16 × 10$^5$ |
| Flexural Strength at 450° F. (232.2° C.), |  |

TABLE I-continued

|  | PRODUCT FROM EXAMPLE 1 |
|---|---|
| psi | 6,815 |
| kPa | 46,988 |
| Flexural Modulus at 450° F. (232.2° C.), | |
| psi | $2.41 \times 10^5$ |
| kPa | $16.62 \times 10^5$ |

EXAMPLE 2 and COMPARATIVE EXPERIMENTS

Epoxy resins and amine curing agents as listed in Table II were blended and cured as described in Example 1. Glass transition temperatures (Tg) and fracture toughness energy ($G_{1C}$) of the corresponding clear castings were reported also in Table II.

TABLE II

| COMPONENTS AND RESULTS | EXAMPLE 2 | COMP. EXPT. A* | COMP. EXPT. B* | COMP. EXPT. C* | COMP. EXPT. D* | COMP. EXPT. E* |
|---|---|---|---|---|---|---|
| Epoxy resin type/grams/equiv. | A/250/1.534 | A/250/1.534 | A/250/1.534 | B/250/1.082 | C/250/1.404 | D/250/1.337 |
| Curing agent type/grams/equiv. | A/53/1.233 | B/75/1.515 | C/95/1.532 | A/36/.837 | A/48/1.116 | A/46/1.070 |
| Tg (°C.) | 304 | 295 | 308 | 250 | 220 | 240 |
| $G_{1C}$ | 0.13 | 0.07 | 0.08 | 0.06 | 0.24 | 0.09 |

*Not an example of this invention

We claim:
1. A curable composition comprising a mixture of
(A) at least one of
(1) at least one epoxy resin represented by the following formulas (I) or (II)

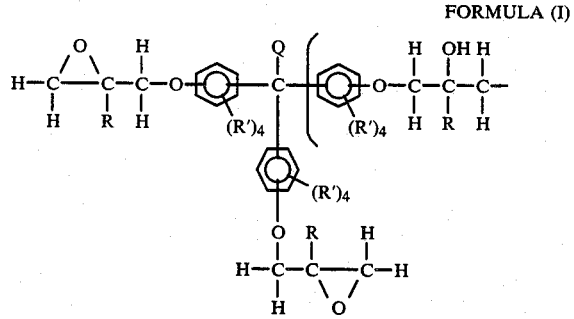

FORMULA (I)

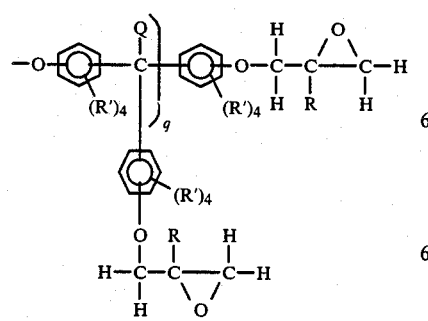

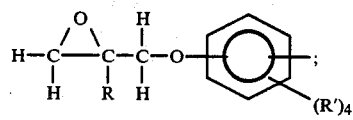

FORMULA (II)

wherein each B is represented by the formula

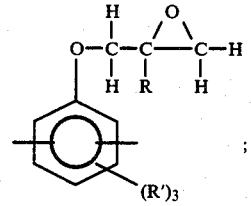

each B' is represented by the formula

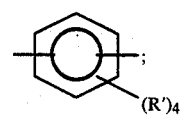

each B'' is represented by the formula

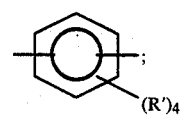

each R is independently hydrogen or an alkyl group having from 1 to about 4 carbon atoms; each Q is independently hydrogen or a hydrocarbyl group having from 1 to about 10 carbon atoms; each R' is independently hydrogen, a hydrocarbyl or hydrocarbyloxy group having from 1 to about 10 carbon atoms or a halogen; m has a value of n−1; m' has a value of n'−1; m" has a value of n"−1; each n, n' and n" independently has a value from zero to about 3; q has a value from zero to about 4; and each z and z' independently has a value from zero to about 3;
(2) the reaction product of
(a) at least one epoxy resin as defined in component (A-1) and
(b) at least one dihydric phenol represented by the following formulas (III) or (IV)

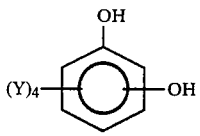
FORMULA (III)

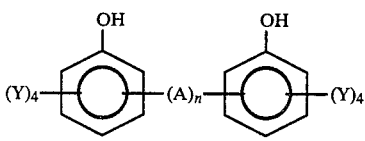
FORMULA (IV)

wherein A is a divalent hydrocarbon group having from 1 to about 12 carbon atoms, —S—, —S—S—,

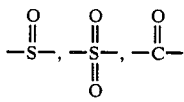

or —O—; each Y is independently hydrogen, a halogen or a hydrocarbyl or hydrocarbyloxy group having from 1 to about 10 carbon atoms; and n has a value of zero or 1; and wherein components (a) and (b) are present in quantities such that the ratio of phenolic hydroxyl groups to epoxide groups is from about 0.01:1 to about 0.5:1;
(3) mixtures thereof;
(B) at least one amine substituted aromatic sulfonic acid amide represented by the following formula (V)

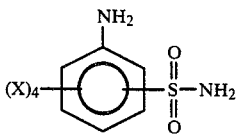
FORMULA (V)

wherein each X is independently hydrogen, a monovalent hydrocarbyl group having from 1 to about 10 carbon atoms or a halogen; and wherein components (A) and (B) are present in quantities such that the ratio of epoxy groups to hydrogen atoms attached to a nitrogen atom is from about 0.8:1 to about 2:1.

2. A composition of claim 1 wherein components (A) and (B) are present in quantities such that the ratio of epoxy groups to hydrogen atoms attached is from about 0.9:1 to about 1.25:1.

3. A composition of claim 1 wherein component (A) is component (A-1) wherein Q is hydrogen, each R' is hydrogen and m has an average value of from about 0.1 to about 2.

4. A composition of claim 3 wherein in component (A-1) m has an average value of from about 0.5 to about 1.5 and component (B) is sulfanilamide.

5. A composition of claim 2 wherein component (A) is component (A-1) wherein Q is hydrogen, each R' is hydrogen and m has an average value of from about 0.1 to about 2.

6. A composition of claim 5 wherein in component (A-1) m has an average value of from about 0.5 to about 1.5 and component (B) is sulfanilamide.

7. A composition of claim 1 wherein component (A) is component (A-2) wherein in component (A-2-a) Q is hydrogen, each R' is hydrogen and m has an average value of from about 0.1 to about 2; component (A-2-b) is represented by formula (IV) wherein A is a divalent hydrocarbyl group having from about 1 to about 6 carbon atoms, n has a value of 1, and components (A-2-a) and (A-2-b) are employed in quantities such that the ratio of phenolic hydroxyl groups to epoxide groups is from about 0.05:1 to about 0.25:1.

8. A composition of claim 7 wherein in component (A-2-a) n has an average value of from about 0.5 to about 1.5; components (A-2-a) and (A-2-b) are employed in quantities which provides a ratio of phenolic hydroxyl groups to epoxide groups of from about 0.1:1 to about 0.2:1; and component (B) is sulfanilamide.

9. A composition of claim 2 wherein component (A) is component (A-2) wherein in component (A-2-a) Q is hydrogen, each R' is hydrogen and m has an average value of from about 0.1 to about 2; component (A-2-b) is represented by formula (IV) wherein A is a divalent hydrocarbyl group having from about 1 to about 6 carbon atoms, n has a value of 1, and components (A-2-a) and (A-2-b) are employed in quantities which provides a ratio of phenolic hydroxyl groups to epoxide groups of from about 0.05:1 to about 0.25:1.

10. A composition of claim 9 wherein in component (A-2-a) n has an average value of from about 0.5 to about 1.5; components (A-2-a) and (A-2-b) are employed in quantities which provides a ratio of phenolic hydroxyl groups to epoxide groups of from about 0.1:1 to about 0.2:1; and component (B) is sulfanilamide.

11. A curable composition comprising a mixture of
(A) at least one of
(1) at least one epoxy resin represented by the following formulas (I) or (II)

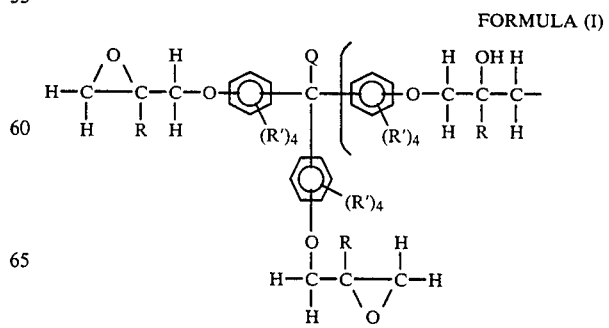
FORMULA (I)

-continued

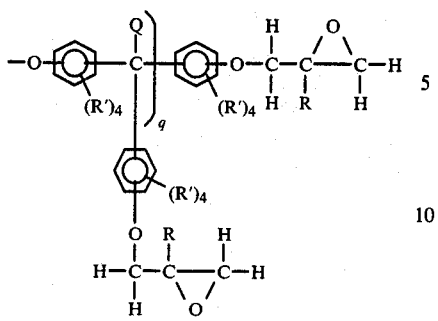

FORMULA (II)

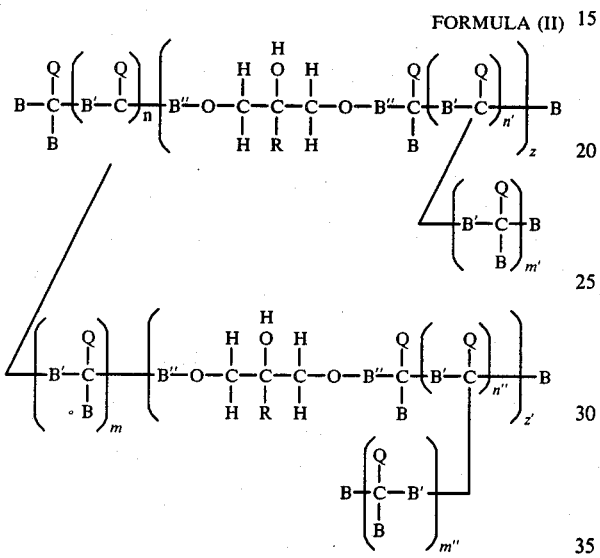

wherein each B is represented by the formula

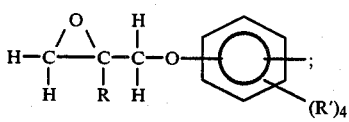

each B' is represented by the formula

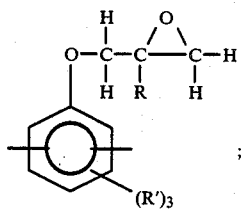

each B" is represented by the formula

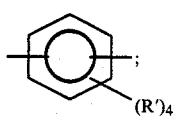

each R is independently hydrogen or an alkyl group having from 1 to about 4 carbon atoms; each Q is independently hydrogen or a hydrocarbyl group having from 1 to about 10 carbon atoms; each R' is independently hydrogen, a hydrocarbyl or hydrocarbyloxy group having from 1 to about 10 carbon atoms or a halogen; m has a value of n−1; m' has a value of n'−1; m" has a value of n"−1; each n, n' and n" independently has a value from zero to about 3; q has a value from zero to about 4; and each z and z' independently has a value from zero to about 3;

(2) the reaction product of
(a) at least one epoxy resin as defined in component (A-1) and
(b) at least one dihydric phenol represented by the following formulas (III) or (IV)

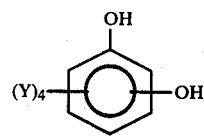

FORMULA (III)

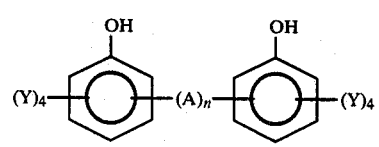

FORMULA (IV)

wherein A is a divalent hydrocarbon group having from 1 to about 12 carbon atoms, —S—, —S—S—,

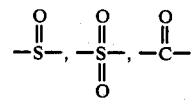

or —O—; each Y is independently hydrogen, a halogen or a hydrocarbyl or hydrocarbyloxy group having from 1 to about 10 carbon atoms; and n has a value of zero or 1; and wherein components (a) and (b) are present in quantities such that the ratio of phenolic hydroxyl groups to epoxide groups is from about 0.01:1 to about 0.5:1;

(3) mixtures thereof;

(B) at least one amine substituted aromatic sulfonic acid amide represented by the following formula (V)

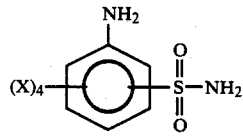

FORMULA (V)

wherein each X is independently hydrogen, a monovalent hydrocarbyl group having from 1 to about 10 carbon atoms or a halogen; and x has a value of zero; and (C) from zero to about 50 percent by weight of the combined weight of components (A), (B) and (C) of at least one solvent; and wherein components (A) and (B) are present in quantities such that the ratio of epoxy groups to hydrogen atoms attached to a nitrogen atom is from about 0.8:1 to about 2:1.

12. A composition of claim 11 wherein components (A) and (B) are present in quantities such that the ratio of epoxy groups to hydrogen atoms attached to a nitrogen atom is from about 0.9:1 to about 1.25:1 and component (C) is present in quantities of from about 10 to about 45 percent by weight of the combined weight of components (A), (B) and (C).

13. A composition of claim 11 wherein component (A) is component (A-1) wherein Q is hydrogen, each R' is hydrogen and m has an average value of from about 0.1 to about 2.

14. A composition of claim 13 wherein in component (A-1) m has an average value of from about 0.5 to about 1.5 and component (B) is sulfanilamide.

15. A composition of claim 12 wherein component (A) is component (A-1) wherein Q is hydrogen, each R' is hydrogen and m has an average value of from about 0.1 to about 2.

16. A composition of claim 15 wherein in component (A-1) m has an average value of from about 0.5 to about 1.5 and component (B) is sulfanilamide.

17. A composition of claim 11 wherein component (A) is component (A-2) wherein in component (A-2-a) Q is hydrogen, each R' is hydrogen and m has an average value of from about 0.1 to about 2; component (A-2-b) is represented by formula (IV) wherein A is a divalent hydrocarbyl group having from about 1 to about 6 carbon atoms, n has a value of 1, and components (A-2-a) and (A-2-b) are employed in quantities such that the ratio of phenolic hydroxyl groups to epoxide groups is from about 0.05:1 to about 0.25:1.

18. A composition of claim 17 wherein in component (A-2-a) n has an average value of from about 0.5 to about 1.5; components (A-2-a) and (A-2-b) are employed in quantities which provides a ratio of phenolic hydroxyl groups to epoxide groups of from about 0.1:1 to about 0.2:1; and component (B) is sulfanilamide.

19. A composition of claim 12 wherein component (A) is component (A-2) wherein in component (A-2-a) Q is hydrogen, each R' is hydrogen and m has an average value of from about 0.1 to about 2; component (A-2-b) is represented by formula (IV) wherein A is a divalent hydrocarbyl group having from about 1 to about 6 carbon atoms, n has a value of 1, and components (A-2-a) and (A-2-b) are employed in quantities such that the ratio of phenolic hydroxyl groups to epoxide groups is from about 0.05:1 to about 0.25:1.

20. A composition of claim 19 wherein in component (A-2-a) n has an average value of from about 0.5 to about 1.5; components (A-2-a) and (A-2-b) are employed in quantities which provides a ratio of phenolic hydroxyl groups to epoxide groups of from about 0.05:1 to about 0.25:1; and component (B) is sulfanilamide.

21. A composition of claim 20 wherein components (A-2-a) and (A-2-b) are employed in quantities such that the ratio of phenolic hydroxyl groups to epoxide groups is from about 0.1:1 to about 0.2:1.

22. A substrate impregnated with a composition of claims 11, 12, 13, 14, 15, 16, 17, 18, 19, 20 or 21.

23. An electrical or structural laminate or composite containing one or more layers of a cured impregnated substrate or combination of substrates of claim 22.

24. An electrical laminate of claim 23 having at least one external layer of an electrically conductive material.

25. An electrical laminate of claim 24 wherein said electrically conductive material is copper.

* * * * *